(12) United States Patent
Slimani et al.

(10) Patent No.: US 12,144,266 B1
(45) Date of Patent: *Nov. 12, 2024

(54) SUPERCONDUCTOR SYNTHESIS METHOD (71) Applicant: Imam Abdulrahman Bin Faisal University, Dammam (SA)

(72) Inventors: Yassine Slimani, Dammam (SA); Munirah Abdullah Almessiere, Dammam (SA); Faten Ben Azzouz, Dammam (SA)

(73) Assignee: Imam Abdulrahman Bin Faisal University, Dammam (SA)

( * ) Notice: Subject to any disclaimer, the term of this patent is extended or adjusted under 35 U.S.C. 154(b) by 0 days.

This patent is subject to a terminal disclaimer.

(21) Appl. No.: 18/780,582

(22) Filed: Jul. 23, 2024

Related U.S. Application Data

(60) Continuation of application No. 18/600,835, filed on Mar. 11, 2024, now Pat. No. 12,089,510, which is a continuation of application No. 18/364,497, filed on Aug. 3, 2023, now Pat. No. 12,069,968, which is a continuation of application No. 17/320,660, filed on May 14, 2021, now Pat. No. 11,770,983, which is a division of application No. 16/161,430, filed on Oct. 16, 2018, now Pat. No. 11,107,967.

(51) Int. Cl.
*H10N 60/85* (2023.01)
*H10N 60/01* (2023.01)
*H10N 60/20* (2023.01)

(52) U.S. Cl.
CPC ....... *H10N 60/857* (2023.02); *H10N 60/0268* (2023.02); *H10N 60/203* (2023.02)

(58) Field of Classification Search
CPC . H10N 60/203; H10N 60/0268; H10N 60/857
See application file for complete search history.

(56) References Cited

U.S. PATENT DOCUMENTS

| 5,041,414 | A | | 8/1991 | Reich | |
|---|---|---|---|---|---|
| 5,089,468 | A | * | 2/1992 | Yoshida | H10N 60/0268 264/332 |

(Continued)

FOREIGN PATENT DOCUMENTS

| CN | 103496965 A | 1/2014 |
|---|---|---|
| CN | 102534787 B | 8/2015 |
| JP | 64-61343 | 3/1989 |

OTHER PUBLICATIONS

Matsumoto, et al; Superconductivity and Crystal Structure of the Y Ba Cu O-WO System; The Japan Society of Applied Physics; Japanese Journal of Applied Physics, vol. 269 Part 2, No. 3; Feb. 8, 1990; Abstract.

(Continued)

*Primary Examiner* — Paul A Wartalowicz
(74) *Attorney, Agent, or Firm* — Oblon, McClelland, Maier & Neustadt, L.L.P.

(57) ABSTRACT

A superconducting material includes $YBa_2Cu_3O_{7-\delta}$ and a nano-structured, preferably nanowires, $WO_3$ dopant in a range of from 0.01 to 3.0 wt. %, preferably 0.075 to 0.2 wt. %, based on total material weight. Methods of making the superconductor may preferably avoid solvents and pursue solid-state synthesis employing Y, Ba, and/or Cu oxides and/or carbonates.

11 Claims, 8 Drawing Sheets

(56) References Cited

U.S. PATENT DOCUMENTS

| | | | |
|---|---|---|---|
| 5,756,427 A | | 5/1998 | Zhou |
| 5,856,276 A | * | 1/1999 | Koshy ............... H10N 60/0576 |
| | | | 505/238 |
| 7,056,866 B1 | | 6/2006 | Chu |
| 8,361,931 B2 | | 1/2013 | Salavati-Niasari et al. |
| 11,770,983 B2 | | 9/2023 | Slimani |
| 12,069,968 B2 | * | 8/2024 | Slimani ............... H10N 60/203 |
| 12,089,510 B2 | * | 9/2024 | Slimani ............. H10N 60/0268 |
| 2004/0198610 A1 | | 10/2004 | Weinstein |
| 2005/0159298 A1 | | 7/2005 | Rupich |
| 2014/0148343 A1 | | 5/2014 | Tobita |

OTHER PUBLICATIONS

Huhne, et al; Application of textured highly alloyed Ni—W tapes for preparing coated conductor architectures; Superconductor Science and Technology, vol. 23, No. 3; Feb. 22, 2010; Abstract.

Nipan, et al; Solid Solutions in the Y—Ba—W—Cu—O System; Inorganic Material 34(6), pp. 585-590; Jun. 1988; Abstract.

Yang, et al; A possible explanation of the recovery of superconductivity of quenched YBa2Cu3O7-x doped by WO3; Journal of Physics Condensed Matter 9(42); Jan. 1999; Abstract.

Slimani, et al; Influence of WO3 nanowires on structural, morphological and flux pinning ability of YBa2Cu3Oy superconductor; 31 Page Paper.

McGinn et al. "Texture processing of bulk YBa2Cu3O6+x by zone melting."Physica C 161 (1989) 198-204. (Year: 1989).

* cited by examiner

SUPERCONDUCTOR SYNTHESIS METHOD

CROSS-REFERENCE TO RELATED APPLICATIONS

The present application is a Continuation of U.S. application Ser. No. 18/600,835, now allowed, having a filing date of Mar. 11, 2024 which is a Continuation of U.S. application Ser. No. 18/364,497, now allowed, having a filing date of Aug. 3, 2023 which is a Continuation of U.S. application Ser. No. 17/320,660, now U.S. Pat. No. 11,770,983, having a filing date of May 14, 2021 which is a Divisional of U.S. application Ser. No. 16/161,430, now U.S. Pat. No. 11,107,967, having a filing date of Oct. 16, 2018.

BACKGROUND OF THE INVENTION

Field of the Invention

This application relates to superconducting materials, particularly yttrium barium copper oxide superconductors, and methods of improving superconductors performances.

Description of the Related Art

An important objective in the field of superconductivity is to enhance the critical current density ($J_c$, or "$J_{cm}$" as used herein) and critical magnetic field ($H_c$) parameters for high temperature superconductors (HTS) because low $J_c$ and $H_c$ values are detrimental for technological applications of superconductors. The yttrium phases $YBa_2Cu_3O_{7-\delta}$ (frequently abbreviated as Y-123 or YBCO) systems are of interest among HTS materials for certain applications because of YBCO's outstanding properties and chemical stability. However, the $J_c$ of YBCO compound remains sensitive to grain-boundary quality which affects, e.g., rate of growth, textural and microstructural relationships between phases, and compositional variations.

It is known that magnetic fields can penetrate these materials as flux lines, also called vortex, and if the flux lines can be fixed in place, i.e., by a technique known as "flux pinning," higher currents can be transported through the material without causing flux flow. This flux pinning controls the practical limits of applied material performance. Several studies on improving the $J_c$ and $H_c$ parameters of YBCO compounds have been conducted.

Two methods are commonly used for producing bulk ceramics such as thick and thin film YBCO superconducting compounds characterized by a high critical current density. The first production method involves excluding weak links in the superconductor structure. The second production method involves adding defects and impurities of a specific size, apart from those which occur naturally, which act as artificial "pinning sites" to impede the motion of flux lines and thus improve the flux pinning capability.

Methods of preparing $YBa_2Cu_3O_y$ by controlling microstructural characteristics have been tested. Artificially introducing inhomogeneities and/or secondary phase materials as flux pinning centers in high temperature superconductors has been seen as an adequate and practical technique. The structure, microstructure, electrical resistivity, and magnetic properties of the YBCO compounds can be changed by using additives, chemical doping, or oxygen doping. The type and amount of inclusions and the preparation process can also play a role in microstructure development and superconducting properties of these materials.

Published studies have reported that several classes of oxide dopants and additives, including magnetic metals, non-magnetic metals, insulators, and semiconductors, have revealed positive effects on critical current densities in high critical temperature superconductors. Oxide dopants and additives used in past strategies have included, inter alia, Ca, Li, Al, Cu, Mn, Ag, Co, Zn, C, Na, Zr, Ti, Si, Sn, Fe, and In, though most of these oxide dopants do not significantly enhance flux pinning. Accordingly, further investigations are needed in order to improve the properties of superconducting materials.

Tungsten oxide materials are known to exhibit high electrical conductivity. The effects of tungsten oxide nanostructures on superconducting properties of YBCO compounds have not been widely reported.

CN 102534787 B (Yang) discloses a single-domain yttrium barium copper oxide superconductive bulk material preparation method, comprising preparing $Y_2BaCuO_5$ precursor powder, preparing liquid phase source powder, pressing the $Y_2BaCuO_5$ precursor bulk and liquid phase block, pressing a supporting block, preparing a blank, infiltration growing single domain $Y_2Ba_4CuOx$ (Y-241) bulk material, and oxygen diffusion processing. Yang uses a top crystal seed infiltration growing method that includes adding metal oxide ($Bi_2O_3$ and $WO_3$ powder) into a second phase of nanoparticles such as $Y_2Ba_4CuBiO_x/Y_2Ba_4CuMO_x$ (M is Bi, W) to form flux pinning centers. The Yang process simplifies the powder preparation process, shortens the experimental period, reduces the experimental cost and improves the flux pinning ability of the superconductor. A superconductor can be prepared from a $Y_2O_3$ supporting block in the yttrium barium copper oxide bulk material that is subject to a slow cold growing process, stably supports two blocks above, to prevent loss of the liquid phase. The invention can be used for preparing yttrium barium copper oxide superconductive bulk material and can also be used for preparing Gd, Sm, Nd, Eu and other series of high temperature superconductors.

Yang relies on a top crystal seed infiltration growing method to produce superconducting materials. While Yang may indicate that $WO_3$ may be used in to make superconductors, Yang generally describes the preparation of $Y_2Ba_4CuBiO_x/Y_2Ba_4CuMO_x$ (M is Bi, W) compounds.. Yang does not disclose a superconducting material comprising $YBa_2Cu_3O_{7-\delta}$ and an amount of $WO_3$ nanowires in the range of 0.01 wt. % to 3.0 wt. %, nor does Yang particularly describe the crystal structure of the resultant YCBO.

U.S. Pat. No. 8,361,931 (Salavati-Niasari) discloses a method for preparing yttrium barium copper oxide ("YBCO"; "Y-123"; $YBa_2Cu_3O_{7-\delta}$) superconducting nanoparticles. Salavati-Niasari's YBCO nanoparticles are prepared via a solid-state reaction of an yttrium precursor, a barium precursor, and a copper precursor. One or more of the precursors are metal chelates of acetylacetone, which are highly stable and have a high compatibility with the other precursors.

However, Salavati-Niasari fails to disclose using $WO_3$ at all, and rather than including nanostructures of $WO_3$ into a superconducting material comprising $YBa_2Cu_3O_{7-\delta}$, particularly a Y-123 including 0.01 wt. % to 3.0 wt. % $WO_3$ nanowires, Salavati-Niasari instead focusses on making Y-123 nanowires.

CN 103496965 A (Ding) discloses a method of making a yttrium barium copper oxide superconductive nanowire. Ding's method comprises: (a) making a precursor solution; mixing yttrium oxide $Y_2O_3$, barium hydroxide $Ba(OH)_2$, and copper acetate $Cu(CH_3COO)_2$, in a molar ratio of $Y_2O_3$:Ba:Cu of 1:2:3, and dissolving into 10 to 30 mol. % of aq. acetate solutions; stirring the acetate solutions for 0.5 to 1.5 hours with a magnetic stirrer, and evaporating the solvent to obtain a gel; adding glycol to the gel; then adding an appropriate amount of ammonia, regulating the solution's pH to 5 to 7 to prepare the precursor solution with a total concentration of Y, Ba, and Cu at 1.5 to 3.0 mol/L; placing a porous anodic alumina template into the precursor solution, ultrasonicating for 5 to 15 minutes, stirring at 60 to 80° C. for 12 hours, then baking in a baking box at 90° C. for 10 to 15 hours to form the gel on the porous anodic alumina template containing the precursor solution; finally heat treating at 800 to 900° C. and annealing at 450 to 550° C. to form the Y-123 superconductive nanowire.

However, Ding fails to disclose using a dopant, much less $WO_3$ or nano-structures thereof, and, rather than including nanostructures of $WO_3$ into a Y-123 superconductor, Ding focusses on making Y-123 nanowires. Moreover, Ding employs solution-based synthetic methods using $Ba(OH)_2$ and $Cu(H_3COOH)_2$ rather than, e.g., CuO and/or $BaCO_3$. Ding uses water, glycol, and ammonia and a ~500° C. annealing step.

JP 564-061343 A (Matsubara) discloses a Y component raw material, such as $Y_2O_3$, to which is added a Ba component raw material, such as $BaCO_3$, a Cu component raw material, such as CuO, and further a W component raw material, such as $WO_3$, such that 0<W/Cu<0.5, optionally blended with a flux, such as an alkaline (earth) metal halide, using a ball mill, and calcined at 500 to 950° C. to give sintered powder having ≤1 μm particle diameter and a uniform particle diameter distribution. The powder is sintered at 850 to 1,000° C., ground, molded into a desired shape in air or an oxygen-containing atmosphere to give a ceramic having ≥95 K critical temperature and oxygen deficient perovskite-type structure.

Although Matsubara discloses using $WO_3$, Matsubara does so by combining and calcining $BaCO_3$, CuO, $Y_2O_3$, and $WO_3$ together. Matsubara does not describe forming YBCO, then calcining with preformed $WO_3$ nanostructures, and does not disclose a superconducting material comprising $YBa_2Cu_3O_{7-\delta}$ and an amount of $WO_3$ nanowires in the range of 0.01 wt. % to 3.0 wt. %.

*Jpn. J. Appl. Phys.* 1990, 29, L416 (Matsumoto et al.) describes the relationship between the superconductivity and crystal structure of the $Y_1Ba_2Cu_3O_{7-y}$—$WO_3$ system. Matsumoto discloses that tungsten oxide has various oxidized states, and mixed $WO_3$ in YBCO donates its oxygen atoms to YBCO, finding that the orthorhombic structure of YBCO is modified by mixing of $WO_3$. Matsumoto further reports that the lattice constant a increases with increasing concentration of $WO_3$, while the others, b and c, do not significantly change, and, although the atomic arrangement in the Cu(2)—O plane of YBCO is consequently modified, the superconducting transition temperature, $T_c$, remains nearly constant.

Further, Matsumoto uses unstructured $WO_3$ powder, not nano-structure $WO_3$, e.g., nanowires. Also, in Matsumoto, the orthorhombicity of YBCO is modified by mixing with $WO_3$ powder, indicative of a distinction between Matsumoto's powder and $WO_3$ nanowires. Matsumoto does not disclose a superconducting material comprising $YBa_2Cu_3O_{7-\delta}$ and an amount of $WO_3$ nanowires in the range of 0.01 wt. % to 3.0 wt. %.

*Supercond. Sci. Technol.* 2010, 23(3), 4015 (Hühne et al.) discloses an epitaxial $Y_2O_3$/YSZ/$CeO_2$ buffer architecture on cube textured Ni-5 at. % W, Ni-7.5 at. % W and Ni-9 at. % W tapes, prepared using pulsed laser deposition. YBCO layers were deposited on the buffered tapes, showing an in-plane texture spread of about 7° and microstructural interfaces and a homogeneous surface structure. A superconducting transition temperature of 89 K with a small transition width was observed for all metal substrates, and a critical current density $J_c$ of more than 0.9 MA $cm^{-2}$ was measured inductively at 77 K in the self-field.

However, Hühne requires Ni—W tapes to be used as templates and is silent to $WO_3$ nano-structures, much less adding 0.01 to 3.0 wt. % $WO_3$ nanostructures (such as nanowires) to a superconducting material comprising $YBa_2Cu_3O_{7-\delta}$.

*Inorg. Mater.* 1998, 34(6), 585-590 (Nipan et al.) describes the solubility of tungsten oxide in the Y-123 phase by x-ray diffraction. They report a monoclinic, tungsten-containing solid solution, which is superconducting despite the structural dissimilarity from 123. Substitution of large amounts of tungsten for barium ($YBaWCu_3O_x$) leads to the formation of a non-superconducting orthorhombic phase.

However, Nipan produces $YBa_1W_1Cu_3O_x$ compounds, in which the W substitutes Ba sites, i.e., Y-113-like compounds. Nipan shows that substituting W for Ba to form $YBa_1W_1Cu_3O_x$, leads to the formation of a non-superconducting orthorhombic phase. Nipan does not succeed in synthesizing superconducting orthorhombic phase. In addition, Nipan does not add $WO_3$ nanostructures to its Y-113-like material, much less $WO_3$ nanowires, and not in $YBa_2Cu_3O_x$ precursor, i.e., Y-123. Nipan does not disclose a superconductor comprising $YBa_2Cu_3O_{7-\delta}$ and 0.01 to 3.0 wt. % $WO_3$ nano-structures, such as nanowires.

*J. Phys. Cond. Matter* 1999, 9(43), 9315 (Yang et al.) discloses two $YBa_2Cu_3O_{7-x}$ samples quenched in air to room temperature. Its undoped YBCO is not a superconductor and the 3 wt. % $WO_3$-doped YBCO shows a superconducting transition above 88 K. The Yang NPL states that W does not enter the lattice of $YBa_2Cu_3O_{7-x}$, and that experiments reveal the effect of the $WO_3$ addition on the recovery of superconductivity of its quenched $YBa_2Cu_3O_{7-x}$. Yang's results disclose that W combined with Y, Ba, and Cu form $YBa_2Cu_2WO_{9-\delta}$ small-grain clusters dispersed in the matrix of $YBa_2Cu_3O_{7-x}$. Yang observes differences in both the grain size of $YBa_2Cu_3O_{7-x}$ and the data of thermal diffusivity between its two samples, surmising that a reduction of cooling rate may be responsible for superconductivity recovery.

However, the process described in the Yang NPL produces an undoped Y-123 which is not a superconductor, and the Yang NPL does not indicate using nanostructured $WO_3$ in its material. The Yang NPL describes forming $YBa_2Cu_2WO_{9-d}$ small-grain clusters dispersed in the $YBa_2Cu_3O_{7-x}$ matrix, i.e., additional impurity phases. The Yang NPL does not disclose a superconducting material comprising $YBa_2Cu_3O_{7-\delta}$ and an amount of $WO_3$ nanowires in the range of 0.01 to 3.0 wt. %.

Accordingly, there remains a need for superconductors, particularly of $YBa_2Cu_3O_{7-\delta}$, with modified and/or improved properties, which may be influenced by particular dopants, preferably while maintaining advantageous crystal structures and having enhanced critical current density ($J_c$) and critical magnetic field ($H_c$) parameters.

SUMMARY OF THE INVENTION

Aspects of the invention provide superconducting materials, comprising: $YBa_2Cu_3O_{7-\delta}$; and a nano-structured $WO_3$ dopant in a range of from 0.01 to 3.0 wt. %, based on total material weight. These superconductors may be modified in any permutation with any or all of the features described above or below.

Aspects of the invention provide methods of synthesizing a superconductor, comprising: heating an oxidized form of yttrium, an oxidized form of barium, and an oxidized form of copper in molar ratios of 1 (Y):1.9 to 2.1 (Ba):2.9 to 3.1 (Cu) in a range of from 850 to 1050° C. for a time in a range of from 8 to 16 hours, to obtain a Y-123 superconductor; grinding the Y-123 with 0.01 to 3.0 wt. %, relative to total superconductor mass, of $WO_3$ nano-structures (in form of wires) to form a solid superconductor; pressing the solid superconductor at a pressure in a range of from 500 to 1000 MPa into a pre-sintered form; sintering the pre-sintered form at a temperature in a range of from 900 to 1000° C. for a period in a range of from 4 to 12 hours, to obtain a sintered form; and cooling the sintered form at a rate in a range of from 1 to 10° C./minute to obtain the superconductor. Any of the above permutations of superconductor may be made by such a method.

The $WO_3$ dopant may present in the range of from 0.075 to 0.2 wt. %.

The dopant may include a wire, tube, sphere, prism, or a mixture of two or more of any of these nano-structures. The $WO_3$ nano-structures may comprise nanowires. At least 99 wt. % of the dopant have a nano-wire structure, relative to total dopant weight.

Inventive superconductors may have orthorhombic crystal structure with Pmmm symmetry.

Inventive superconductors may comprise: no more than 0.5 wt. % of $Y_2BaCuO_5$(Y-211); no more than 0.5 wt. % of $YBaCu_2O_{5-\delta}$ (Y112); no more than 0.5 wt. % of $YBa_2Cu_4O_y$ (Y-124); no more than 0.5 wt. % of $Y_2Ba_4Cu_7O_y$ (Y-247); and/or no more than 0.5 wt. % of $BaCuO_2$, based on the total material weight.

Inventive superconductors may comprise no more than 1% of any further phases of YBCO than Y-123, based on the total material weight.

Inventive superconductors may have in their matrices a regular form of nanometer scale entities bright in contrast dispersed into grains and $WO_3$ nanowires taking place within the grains boundaries by filling the voids among the grains.

Inventive superconductors may have a superconducting transition in a range of from 80 to 100 K. Inventive superconductors may have a critical current density ($J_{cm}$) in a range of from $1.0\times10^4$ to $1.4\times10^4$ A/cm², in an applied magnetic field of 0 Tesla, and/or a critical current density ($J_{cm}$) in a range of from 600 to 800 A/cm², in an applied magnetic field one of 1 Tesla. Inventive superconductors may have a critical current density of from $4\times10^3$ to $2\times10^5$ A/cm² across a temperature range of from 60 to 10 K under a magnetic field in a range of from 0 to 6 Tesla.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Aspects of the invention provide superconducting materials, comprising YBCO materials such as $YBa_2Cu_3O_{7-\delta}$ (Y-123) and a nano-structured tungsten oxide dopant such as $WO_3$ in a range of from 0.01 to 3.0 wt. %, based on total material weight. Herein, "superconductor" and "superconducting material" is treated identically and interchangeably, typically using "superconductor(s)" for brevity. The superconductor itself is not a nanostructure, and may be an amorphous or partially crystalline matrix, containing nano-structured $WO_3$.

Aspects of the invention provide methods of synthesizing a superconductor, comprising: heating an oxidized form of yttrium, an oxidized form of barium, and an oxidized form of copper in molar ratios of 1 (Y):1.9 to 2.1 (Ba):2.9 to 3.1 (Cu) in a range of from 850 to 1050, 900 to 1000, or 925 to 975° C. for a time in a range of from 8 to 16, 10 to 14, or 11 to 13 hours, to obtain a Y-123; grinding the Y-123 with 0.01 to 3.0, 0.02 to 1.0, 0.03 to 0.5, 0.05 to 0.2 wt. %, relative to total superconductor mass, of $WO_3$ nano-structures to form a solid superconductor; pressing the solid superconductor at a pressure in a range of from 500 to 1000, 600 to 900, or 700 to 800 MPa into a pre-sintered form; sintering the pre-sintered form at a temperature in a range of from 900 to 1000, 915 to 985, 925 to 975, or 940 to 960° C. for a period in a range of from 4 to 12, 6 to 10, 7 to 9, or 7.5 to 8.5 hours, to obtain a sintered form; and cooling the sintered form at a rate in a range of from 1 to 10, 2 to 7.5, 2.5 to 6, 3 to 5, or 3.5 to 4.5° C./minute to obtain the superconductor. Any of the above permutations of superconductor may be made by such a method.

The atomic ratio or stoichiometry of the YBCO precursor metal oxides may be 1 (Y):1.9 to 2.1 (Ba):2.9 to 3.1 (Cu), or 1 (Y):2 (Ba):3 (Cu). The oxidized form of Y, Ba, and/or Cu, could be a nitrate, a halide, a carbonate, and/or a pure oxide, preferably including $Y_2O_3$, BaO, $BaCO_3$, CuO, $Cu_2O$, $CuO_2$, and/or $Cu_2O_3$. The metal oxides may use only three, two, one, or no carbonates, but may preferably use one, or even two, most preferably only $BaCO_3$, with non-carbonate Y and Cu, preferably $Y_2O_3$ and CuO.

The $WO_3$ dopant may present in the range of from 0.01 to 3.0, 0.025 to 2.0, 0.025 to 1.0, 0.05 to 0.5, 0.075 to 0.2 wt. %, based on the total superconductor weight. Because the superconductor may be used for a variety of applications, a desirable doping endpoint may be any of the preceding values as a lower and/or upper end point or at least 0.005, 0.01, 0.02, 0.03, 0.04, 0.05, 0.06, 0.07, or 0.08 wt. %, and/or no more than 0.5, 0.45, 0.4, 0.35, 0.3, 0.25, 0.2, or 0.15

The dopant maybe in a form that includes wire(s), tube(s), sphere(s), prism(s), or a mixture of two or more of any of these nano-structures, preferably at least including nanowires. Preferably at least 99, 99.5, 99.9, 99.98, 99.99 or 100% of the dopant have a nano-wire structure.

Inventive methods may further comprise compressing, such as pelletizing, the oxidized forms of yttrium, barium, and copper into a precursor form prior to the heating. The sintering may be conducted in an atmosphere comprising air, e.g., in at least 50, 60, 75, 85, 90, 95, 97.5, 99, or 100%. The $WO_3$ nano-structures may comprise 99, 99.5, 99.8, 99.9, 99.99, or 100% nanowires, based on the total number of $WO_3$ nano-structures, which is also applicable to the superconductors discussed above, and the nanostructure properties discussed above may be applied to the starting material and final, incorporated dopant(s) in inventive methods. The starting material and product dopant(s) will preferably have identical structural properties, ignoring the incorporation of and any particular YBCO-dopant interaction forces.

Inventive superconductors may comprise at least 97, more preferably 98, more preferably 99, more preferably 99.5, more preferably 99.6, more preferably 99.7% $YBa_2Cu_3O_{7-\delta}$ (Y-123), relative to other yttrium-based compounds, wherein, measured volumetrically and/or mass-wise, the Y-123 superconducting material has orthorhombic crystal structure having Pmmm symmetry. The superconductors may contain small amounts, e.g., no more than 1, 0.9, 0.8, 0.7, 0.6, 0.5, 0.4, 0.3% of $Y_2BaCuO_5$ (Y-211).

Inventive superconductors may have at least 97, more preferably 98, more preferably 99, more preferably 99.5, more preferably 99.6, more preferably 99.7% of Y-123 phase having orthorhombic crystal structure and Pmmm symmetry. The superconductor generally comprises single-phase Y-123. Inventive superconductors may comprise no further phases of YBCO than Y-123, or no more than 3, 2.5, 2, 1, 0.5, 0.4, 0.3%, based on a total weight of any phase beyond Y-123. Inventive superconductors preferably comprise no more than 0.5, 0.25, 0.1, 0.05, 0.01, 0.001 or 0.0001%, or even none to detectable limits, of any further phases of YBCO than Y-123, based on the total material weight. Inventive superconductors may comprise no more than 0.5, 0.25, 0.1, 0.05, 0.01, 0.001 or 0.0001% of $Y_2BaCuO_5$(Y-211), and/or $YBaCu_2O_{5-\delta}$ (Y-112), and/or $YBa_2Cu_4O_y$ (Y-124), and/or $Y_2Ba_4Cu_7O_y$ (Y-247), $BaCuO_2$, based on the total material weight, either individually, or combined. Inventive superconductors, however, under some circumstances, may not desirably contain any of these or further phases.

The superconductors within the scope of the invention preferably do not have additional phases beyond the normal YBCO phase and defined $WO_3$ dopant, i.e., has no more than 1, 0.9, 0.8, 0.7, 0.6, 0.5, 0.4, 0.3% of Y-211. Preferably, the inventive superconductors maintain nanowires of $WO_3$ that do not react with $YBa_2Cu_3O_{7-\delta}$, but instead keep their size and preferably contribute with their volume, interfaces, and/or generated defects that may enhance the critical current density $J_{cm}$.

In addition or alternatively, the inventive superconductors are made without chelating ligands on the metals, particularly acetate or acetylacetone (acac). The YBCO used may also be produced from only solids, rather than involving solubilized starting materials, thereby leading to crystal structures as described herein and illustrated in the drawings. The synthesis of superconductors within the invention may be made by any method leading to the claimed structure, but preferably avoids solution phase reactions, particularly avoiding ethylene glycol (glycols generally), ethanol (alcohols generally), and/or water, and can eschew the use of bases, such as ammonia, hydroxides, and the like. Superconductors herein may avoid sustaining temperatures for longer than 1 hour, 45, 30, 15, 10, 5, or 1 minute after the 900+° C. calcining, i.e., an annealing step such as sustained heating in a range of 300 to 600° C. after formation of the YBCO and/or doped YBCO may be avoided.

Inventive superconductors may have in their matrices a regular form of nanometer scale entities bright in contrast dispersed into grains. The nanosized entities may have an average size of 100, 60, 50, 40, 30, or 20 nm in diameter. The nanosized entities are generally well-dispersed, i.e., only 1 in 5, 1 in 10, or 1 in 20 is agglomerated. Inventive superconductors may have in their matrices $WO_3$ nanowires taking place within the grains boundaries by filling the voids among the grains.

Inventive superconductors may have a superconducting transition in a range of from 80 to 100, 85 to 98, 88 to 97, 91 to 96 K, or at least 85, 87, 89, 90, 91, 92, 93, 94, 95, or even 96 K.

Inventive superconductors may have a critical current density ($J_{cm}$) in a range of from $1.0 \times 10^4$ to $1.4 \times 10^4$, $1.1 \times 10^4$ to $1.35 \times 10^4$, $1.2 \times 10^4$ to $1.3 \times 10^4$ A/cm², or at least 1, 1.05, 1.1, 1.15, or $1.2 \times 10^4$ A/cm², in an applied magnetic field of 0 Tesla, and/or a critical current density ($J_{cm}$) in a range of from 600 to 800, 650 to 780, or 700 to 750 A/cm², or at least 600, 625, 650, 675, or 700 A/cm², in an applied magnetic field one of 1 Tesla. Alternatively, or in addition, inventive superconductors may have a critical current density of at least $4 \times 10^3$, $10^4$, $2 \times 10^4$, $3 \times 10^4$, $5 \times 10^4$, or $10^5$ A/cm² at temperature range 60, 50, 40, 30, 20, or 10 K, under a magnetic field in a range of from 0 to 6 Tesla. The critical current density of inventive superconductors enhanced in $WO_3$ added Y-123 compared to non-added Y-123 by factors more than 25, 15, 10, 5, or 2%, at temperature range 77, 70, 60, 50, 40, 30, 20, or 10 K, over the magnetic field range of 0 to 6 Tesla.

EXAMPLE

Pure YBCO samples and $WO_3$ nanowire-doped YBCO samples were synthesized through the solid-state reaction method under identical conditions. The single phase YBCO was synthesized by thoroughly mixing high purity of $Y_2O_3$, $BaCO_3$, and CuO according to the stoichiometric formula of Y:Ba:Cu=1:2:3. This mixture of powders was pelletized and then calcined at 950° C. for 12 h in air. $WO_3$ nanowires were added to the precursor powder Y-123 in the final processing stage, by mixing and hand grinding both powders in an agate mortar. The amount of added $WO_3$ nanowire varied from x=0 to 3 wt. % of the total mass of sample. The mixed powders were pressed into pellets at 750 MPa in the form of circular disks having 13 mm in diameter. The pellets were sintered at 950° C. for 8 hours in air and then cooled to room temperature at a rate of 4° C./min. The non-doped (0 wt. % $WO_3$) sample was used as a reference, then it was hand ground in the same manner as the $WO_3$-doped samples to ensure identical physical conditions for all of the samples.

The resulting samples were characterized using x-ray powder diffraction (XRD), scanning electron microscopy (SEM), electrical resistivity versus temperature, and magnetization versus fields M(H) hysteresis loops.

Referring now to the drawings, wherein like reference numerals designate identical or corresponding parts throughout the several views.

Figure 1:
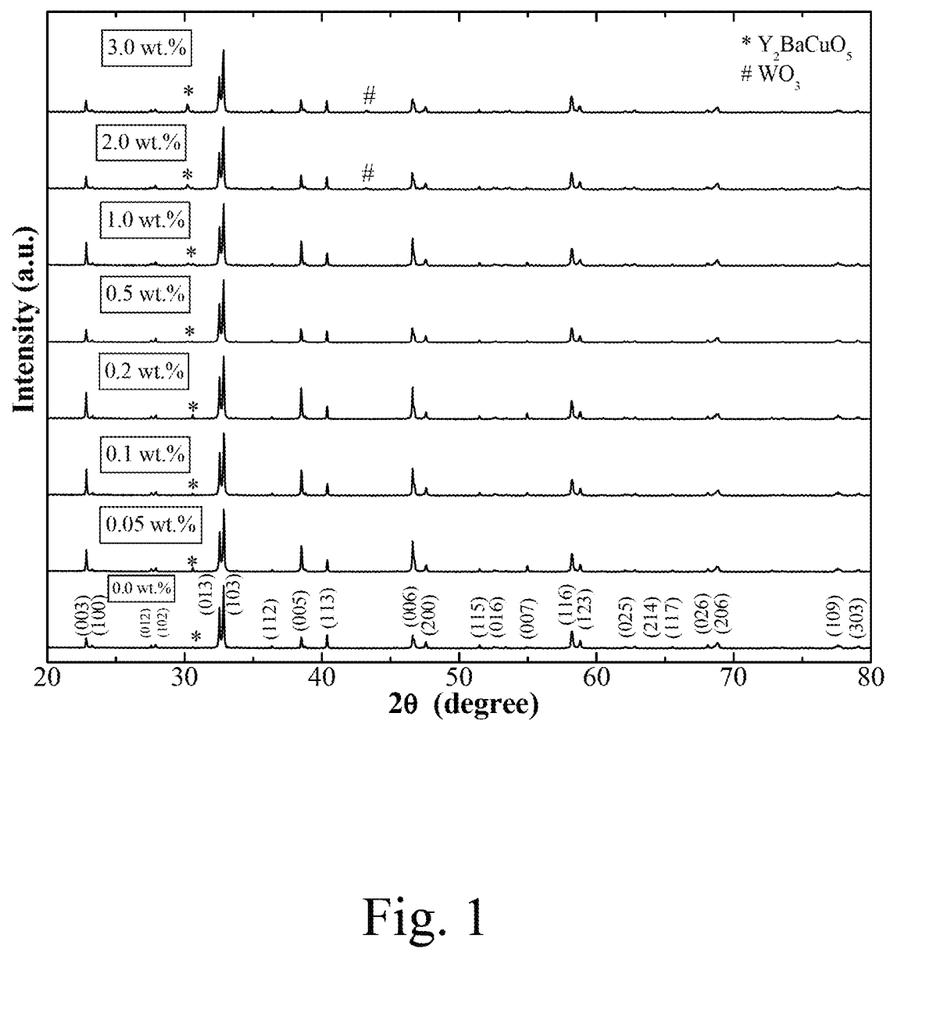
FIG. 1 shows X-ray powder diffraction (XRD) patterns of tungsten oxide ($WO_3$) nanowires added $YBa_2Cu_3O_y$ (Y-123) products.

FIG. 1 illustrates XRD patterns from all products, indicating that each exhibits a predominantly single-phase perovskite $YBa_2Cu_3O_y$ (Y-123) with a very small quantity of $Y_2BaCuO_5$ (Y-211) as secondary phase (about 0.3, 0.35, 0.33, 0.35, 0.5, 0.9, 1.6 and 2.2 for 0.0, 0.05, 0.1, 0.2, 0.5, 1.0, 2.0 and 3.0 wt. % $WO_3$ nanowires added to Y-123 samples, respectively). The synthesized samples crystallized in the orthorhombic structure with Pmmm symmetry. No detrimental effects on the orthorhombicity structure of Y-123 were detected by inserting fine quantities of $WO_3$ nanowires up to 1 wt. % under the accuracy of XRD patterns. For higher amount of $WO_3$ nanowires (≥2 wt. %), $WO_3$ peaks with very low intensity were detected. Therefore, it appears that any phenomenon observed herein for lower amounts (<2 wt. %) of $WO_3$ nanowire-dopant may be irrelevant to structural change in these YBCO products, but fully associated to the inclusion of $WO_3$ nanowires.

Figure 2A:
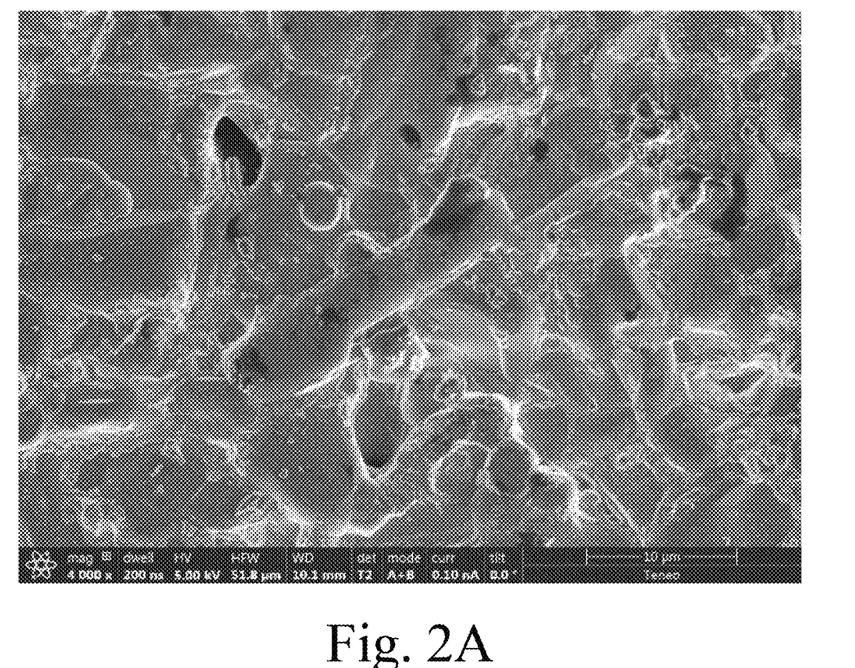
FIG. 2A shows a scanning electron microscope image of $WO_3$ nanowires added to a YBCO sample.
Figure 2B:
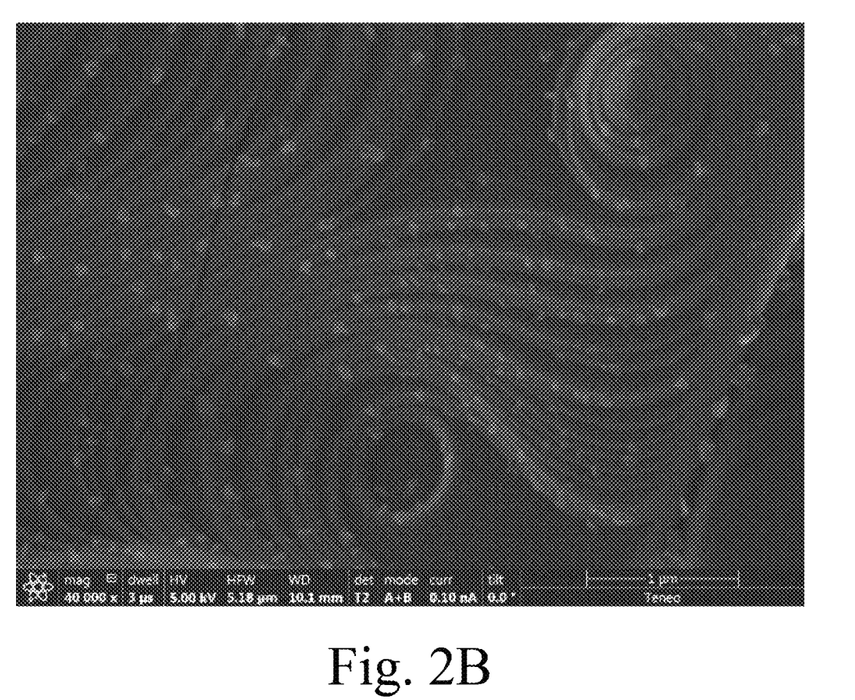
FIG. 2B shows a scanning electron microscope image of $WO_3$ nanowires added to a YBCO sample.

As seen in FIGS. 2A and B, the morphology of Y-123 doped with $WO_3$ nanowires exhibits a granular aspect with a dispersion of fine nano-entities that take place on the surface of grains with relatively uniform distribution. In addition, the $WO_3$ nanowires take place into the grain boundaries by filling the voids among the grains. This could enhance the percolation of current in added sample, particularly the current density $J_c$.

Figure 3A:
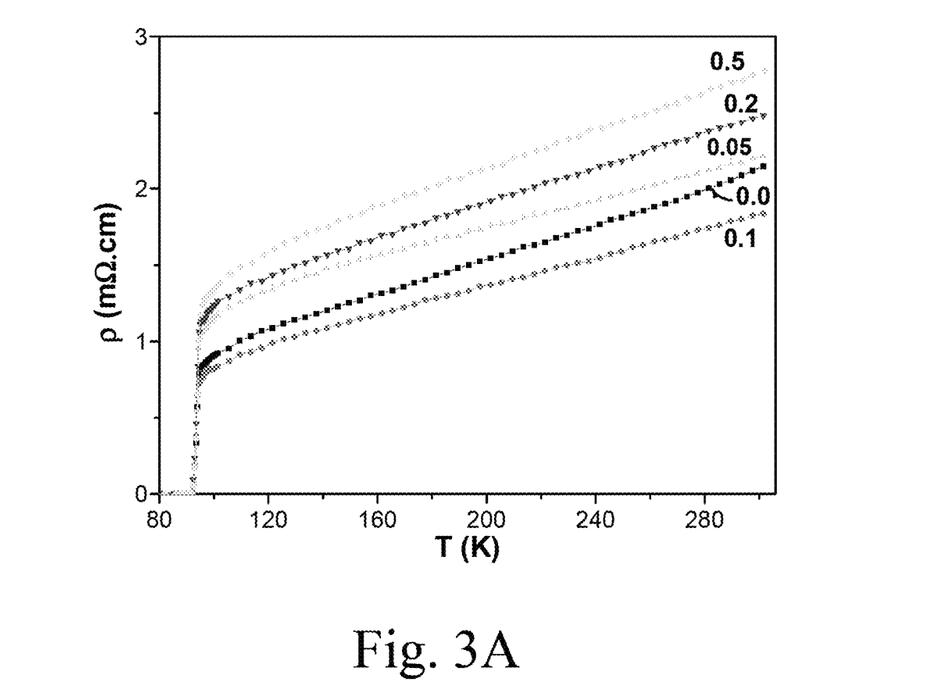
FIG. 3A shows a plot of electrical resistivity versus temperature for Y-123 samples synthesized with different amounts of $WO_3$ nanowires.
Figure 3B:
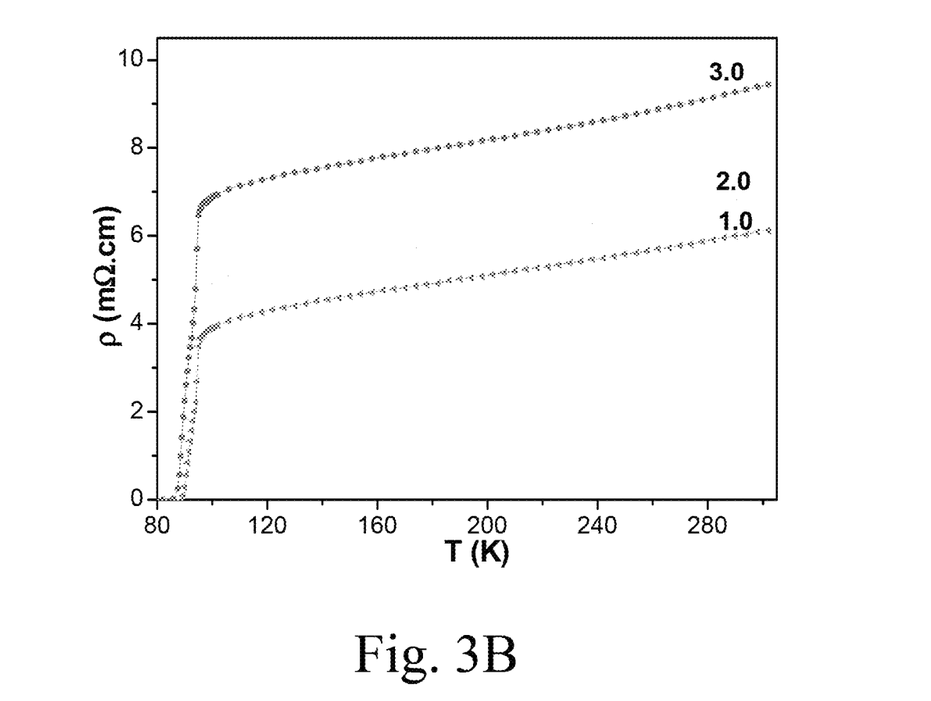
FIG. 3B shows a plot of electrical resistivity versus temperature for Y-123 samples synthesized with different amounts of $WO_3$ nanowires.

FIGS. 3A and 3B shows that all Y-123 samples produced according to the Example exhibit a metal-like behavior in the normal state, with a sharp superconducting transition to zero resistance at $T_{co}$ for lower $WO_3$ nanowires concentrations, i.e., ≤0.5 wt. %. For higher $WO_3$ amounts, i.e., >0.5 wt. %, a broadening superconducting transition was observed. The $T_{co}$ value is found 92.5 K for pristine, undoped compound and the $T_{co}$ remains unchanged up to 0.5 wt. % doping, then decreases with increasing the $WO_3$ nanowires contents. Besides, the 0.1 wt. % NW—$WO_3$ added to Y-123 product exhibit the lowest normal state resistivity compared to pristine sample, suggesting the lowest number of porosity, disorder and inhomogeneity and the highest carrier concentration in this sample. The obtained results suggest the enhancement of flux pinning in this added sample.

Figure 4:
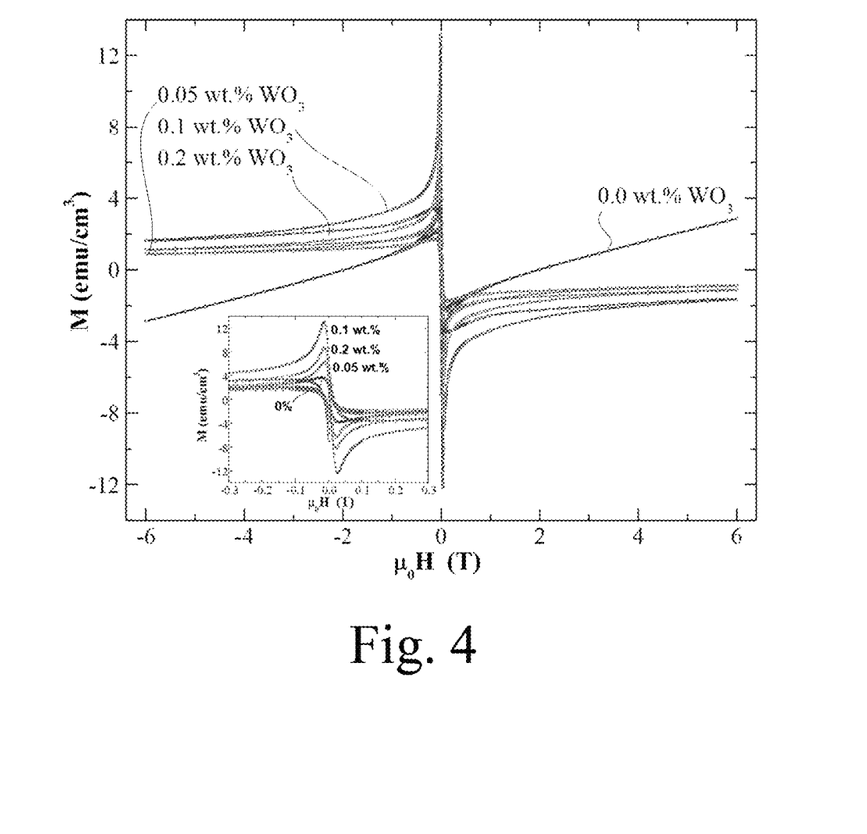
FIG. 4 shows plots of hysteresis magnetization loops measured at 77 K of the products synthesized with amounts of $WO_3$ nanowires varying between 0.0 to 0.2 wt. %.

FIG. 4 illustrates that the magnetization behavior of the inventive superconductor products described herein and the zero-field value of the magnetization are improved for $WO_3$ nanowire-doped samples compared to pristine, undoped one Y-123 synthesized according to the Example. For the products synthesized with a low concentration of $WO_3$ nanowires, e.g., ≤0.1 wt. %, the hysteresis loops M(H) have larger areas and close much later in comparison with those of the pristine product indicating an enhancement of the irreversibility field ($H_{irr}$) and current densities values.

Figure 5A:
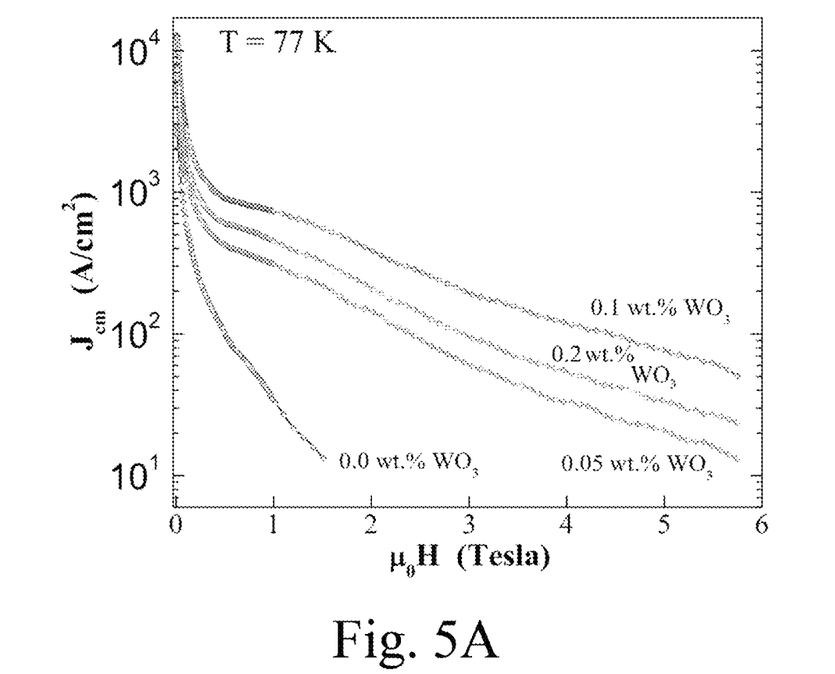
FIG. 5A shows plots of magnetization critical current density ($J_{cm}$) versus magnetic field estimated from M vs. H hysteresis loops at 77 K for pristine and $WO_3$ nanowires-added Y-123 samples.
Figure 5B:
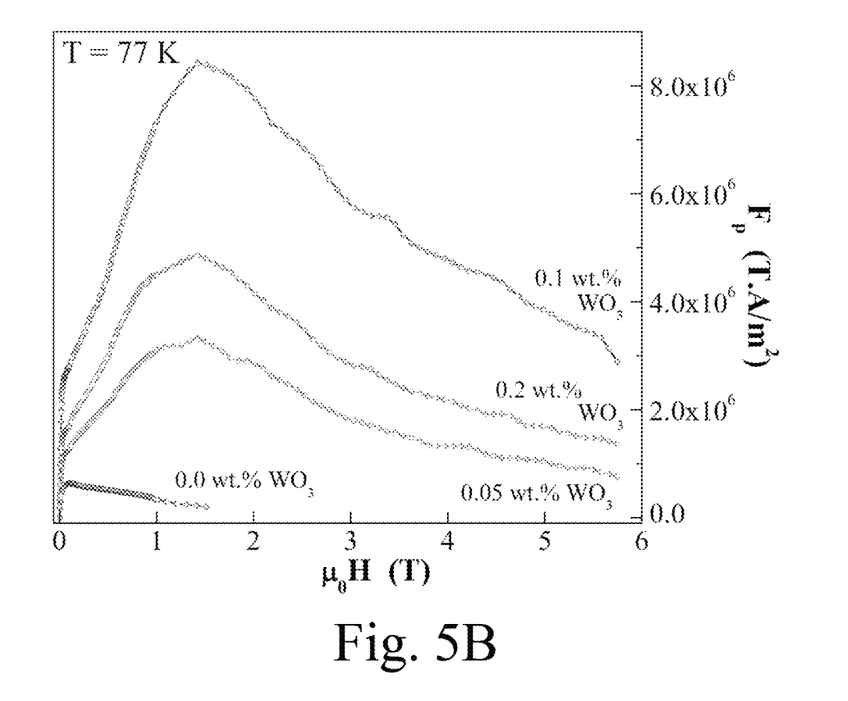
FIG. 5B shows plots of magnetic field dependence of the flux pinning force density at 77 K for pristine and $WO_3$ nanowires-added Y-123 samples.
Figure 6A:
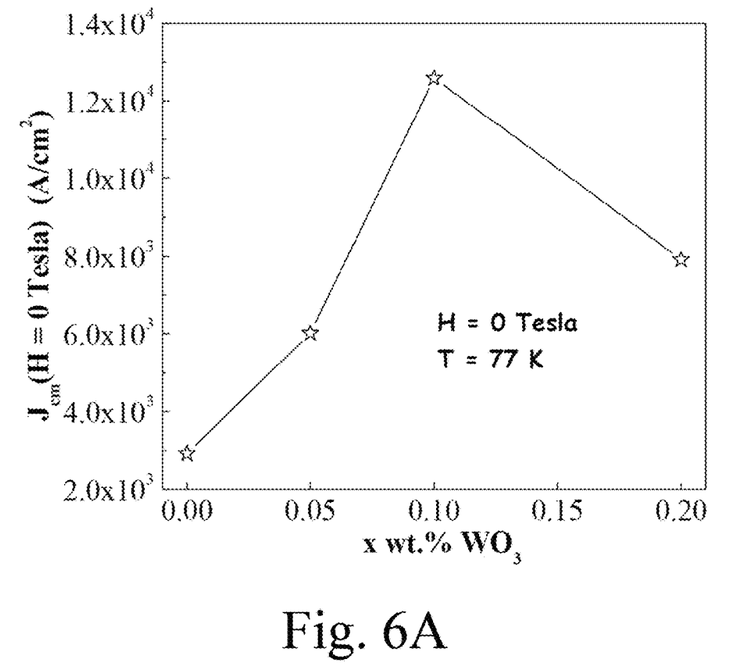
FIG. 6A shows variation of $J_{cm}$ value at an applied magnetic field of 0 Tesla for a Y-123 sample sintered with various amounts of $WO_3$ nanowires.
Figure 6B:
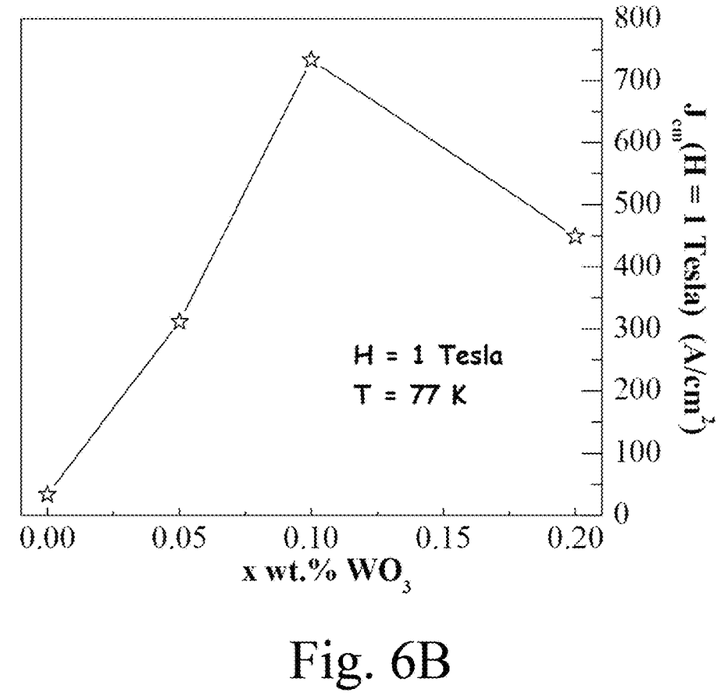
FIG. 6B shows variation of $J_{cm}$ value at an applied magnetic field of 1 Tesla for a Y-123 sample sintered with various amounts of $WO_3$ nanowires.

The intra-granular critical current density ($J_{cm}$) versus magnetic field for various amounts of $WO_3$ nanowires were estimated from the experiments of M vs. H using Bean's critical-state model are shown in FIG. 5A. Throughout the applied magnetic field range, the 0.1 and 0.2 wt. % $WO_3$ nanowires added YBCO samples show higher $J_{cm}$ values compared to the pure Y-123 as synthesized herein. The 0.1 wt. % $WO_3$-doped sample illustrates better performance and the best $J_{cm}$ values in the absence and under applied magnetic fields. Furthermore, the 0.1 wt. % $WO_3$-doped sample exhibits a distinctly higher flux pinning force density, as seen in FIG. 5B. The inclusion of $WO_3$ nanowires in ranges discussed herein may improve the weak bonds of Y-123, possibly strengthening the flux pinning properties of the doped Y-123 product over the measured magnetic field range. The formation of efficient pinning centers due to dopants and/or additives may affect characteristic behavior(s) of the critical current densities.

Figure 7A:
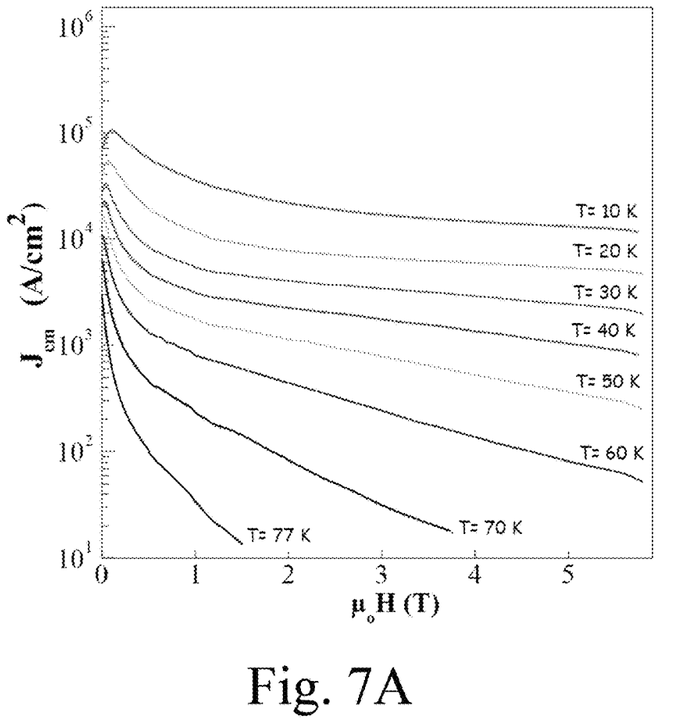
FIG. 7A shows plots of critical current density $J_{cm}$ calculated from the M vs H loops at various temperatures for undoped Y-123 sample.
Figure 7B:
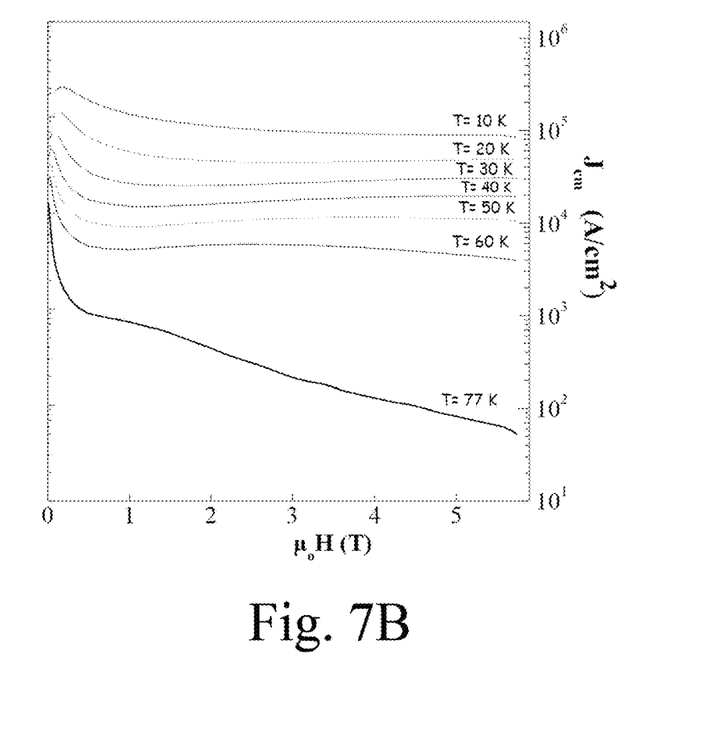
FIG. 7B shows plots of critical current density $J_{cm}$ calculated from the M vs H loops at various temperatures for 0.1 wt. % $WO_3$ nanowires-added Y-123 sample.

As seen in FIG. 7B versus FIG. 7A (undoped), when increasing the $WO_3$ doping content to 0.1 wt. %, the $J_{cm}$ value may improve by a factor of 4.3 in the absence of applied magnetic field and at T=77K. Under an external applied magnetic field of 1 Tesla, the $J_{cm}$ value enhanced by a factor of around 26 (T=77 K). The inclusion of $WO_3$ nanowires as described herein may assist in achieving high flux pinning performances. FIGS. 7A and 7B show the variations of the intra-granular critical current density $J_{cm}$ versus field of the free, undoped (FIG. 7A) and 0.1 wt. % $WO_3$ nanowire-doped samples (FIG. 7B) measured at various temperatures. The results from the Example indicate that the $WO_3$ nanowires reduce the sensitivity to the magnetic field for a temperature ranging from 10 to 77 K. The rate of the decrease of $J_{cm}$ with increasing temperature is lower for the $WO_3$ nanowire-doped sample than for the pristine sample. Across the entire range of the applied magnetic field, the $WO_3$ nanowire-doped sample exhibits a distinctly higher $J_{cm}$ in the entire temperature range compared with the pristine one.

Figure 8:
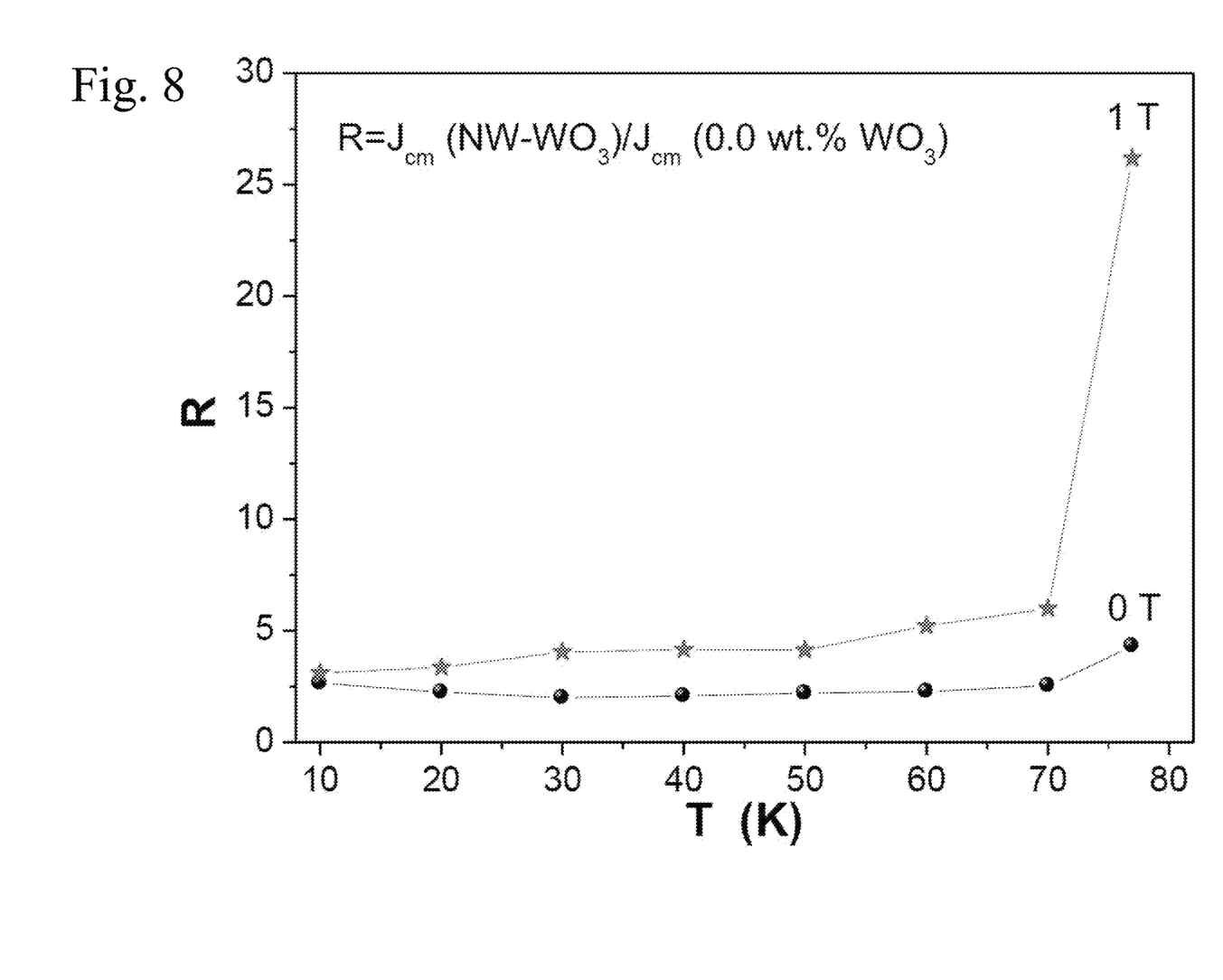
FIG. 8 shows plots of temperature dependence of the ratio of $J_{cm}$ between that of 0.1 wt. % $WO_3$ nanowires added Y-123 and of non-added Y-123, R, at an applied magnetic field of 0 and 1 Tesla.

FIG. 8 illustrates the temperature dependence of the ratio, R, as set forth in Equation 1, immediately below, at applied magnetic fields of 0 and 1 T.

$$R = \frac{J_{cm}(0.1 \text{ wt. \% } NW - WO_3)}{J_{cm}(0.0 \text{ wt. \%})}, \quad \text{Eq. 1}$$

wherein $J_{cm}$ is intra-granular critical current density, NW is the nanowire-doped superconductor, $WO_3$ is the pure nanowire, and 0.0 wt. % is the pure Y-123. FIG. 8 illustrates that the quotients of $J_{cm}$ as a function of temperature for the 0.1 wt. % $WO_3$ nanowires and free added samples for 0 and 1 Tesla applied magnetic fields.

The superconducting materials described herein may be used for application that function to transport higher current densities with very low loss of energy such as in low-loss power and electrical transmission cables; enhance power stability for energy storage such as in fuel cells; improve electromagnetic performance such as in superconducting electromagnets; to generate high magnetic fields for several practical applications. Products, devices and systems may include the superconducting materials for service in transport of higher current densities with very low loss of energy and the generation of high magnetic fields for practical applications.

Numerous modifications and variations of the present invention are possible in light of the above teachings. It is therefore to be understood that within the scope of the appended claims, the invention may be practiced otherwise than as specifically described herein.

The invention claimed is:

1. Superconductor synthesis method a, comprising:
   mixing $Y_2O_3$, $BaCO_3$, and CuO powders and pelletizing to form a pelletized mixture;
   calcining the pelletized mixture comprising the $Y_2O_3$, BaO and CuO in molar ratios of 1 (Y):1.9 to 2.1 (Ba):2.9 to 3.1 (Cu) to a temperature in a range of from 850 to 1050° C. for a time in a range of from 8 to 16 hours, to obtain a Y-123, wherein the $Y_2O_3$, BaO and CuO are free of chelating ligands;
   grinding a precursor mixture comprising the Y-123 and 0.01 to 3.0 wt. %, relative to total mass of the precursor mixture, of nano-structured $WO_3$ to form a superconductor precursor;
   pressing the superconductor precursor at a pressure in a range of from 500 to 1000 MPa into a pre-sintered precursor;
   sintering the pre-sintered precursor at a temperature in a range of from 900 to 1000° C. for a period in a range of from 4 to 12 hours, to obtain a sintered product, wherein the heating, grinding, pressing and sintering are carried out in the absence of a solvent; and
   cooling the sintered product at a rate in a range of from 1 to 10° C./minute to obtain a YBCO superconducting material;
   wherein the YBCO superconducting material, comprises:
   a $YBa_2Cu_3O_{7-\delta}$ matrix phase; and
   0.05 to 0.2 wt. %, based on total superconductor weight, of particles of a dopant,
   wherein the dopant is the nano-structured $WO_3$ in the form of $WO_3$ nanowires and
   wherein the $WO_3$ nanowires are disposed within voids between grain boundaries of the $YBa_2Cu_3O_{7-\delta}$ matrix phase.

2. The method of claim 1, wherein the sintering is conducted in an atmosphere comprising air.

3. The method of claim 1, wherein the YBCO superconducting material has at least 97% $YBa_2Cu_3O_{7-\delta}$ phase with orthorhombic crystal structure and Pmmm symmetry.

4. The method of claim 1, wherein the YBCO superconducting material comprises:
   no more than 0.5% of $Y_2BaCuO_5$ (Y-211);
   no more than 0.5% of $YBaCu_{5-\delta}$ (Y-112);
   no more than 0.5% of $YBa_2Cu_4O_y$ (Y-124);
   no more than 0.5% of $Y_2Ba_4Cu_7O_y$ (Y-247); and
   no more than 0.5% of $BaCuO_2$,
   based on the total phases concentration.

5. The method of claim 1, wherein the YBCO superconducting material comprises no more than 1% of any further phases of YBCO than Y-123, based on the total phases concentration.

6. The method of claim 1, wherein the YBCO superconducting material has in its matrix a regular form of nanometer scale entities bright in contrast dispersed into grains.

7. The method of claim 1, wherein the YBCO superconducting material has a superconducting transition in a range of from 80 to 100 K.

8. The method of claim 1, wherein the YBCO superconducting material has a critical current density ($J_{cm}$) in a range of from $1.0 \times 10^4$ to $1.4 \times 10^4$ A/cm$^2$, in an applied magnetic field of 0 Tesla.

9. The method of claim 1, wherein the YBCO superconducting material has a critical current density ($J_{cm}$) in a range of from 600 to 800 A/cm$^2$, in an applied magnetic field of 1 Tesla.

10. The method of claim 1, wherein the YBCO superconducting material has a critical current density of at least $4 \times 10^3$ to $10^5$ A/cm$^2$ across a temperature range of from 60 to 10 K under a magnetic field in a range of from 0 to 6 Tesla.

11. The method of claim 1, wherein the $WO_3$ nanowires are present in the superconducting material in a range of from 0.075 to 0.2 wt. %.

* * * * *